(12) United States Patent (10) Patent No.: US 12,635,071 B2
Kumon et al. (45) Date of Patent: May 19, 2026

(54) CIRCUIT BOARD

(71) Applicant: TDK Corporation, Tokyo (JP)

(72) Inventors: Mikihiro Kumon, Tokyo (JP);
Teruyasu Sugioka, Tokyo (JP)

(73) Assignee: TDK Corporation, Tokyo (JP)

( * ) Notice: Subject to any disclaimer, the term of this patent is extended or adjusted under 35 U.S.C. 154(b) by 248 days.

(21) Appl. No.: 18/617,079

(22) Filed: Mar. 26, 2024

(65) Prior Publication Data

US 2024/0334596 A1 Oct. 3, 2024

(30) Foreign Application Priority Data

Mar. 28, 2023 (JP) ................................. 2023-051593

(51) Int. Cl.
H05K 1/02 (2006.01)
H05K 1/11 (2006.01)
(52) U.S. Cl.
CPC ........... H05K 1/0296 (2013.01); H05K 1/111 (2013.01); *H05K 2201/09827* (2013.01)
(58) Field of Classification Search
CPC ................. H05K 1/0296; H05K 1/111; H05K 2201/09827

USPC ......................................................... 174/261
See application file for complete search history.

(56) References Cited

U.S. PATENT DOCUMENTS

| | | | |
|---|---|---|---|
| 2012/0241205 A1* | 9/2012 | Shimizu | ................. H05K 1/188 29/829 |
| 2017/0034917 A1* | 2/2017 | Hongo | .................... H01L 23/15 |
| 2017/0213923 A1 | 7/2017 | Toya et al. | |
| 2017/0213928 A1 | 7/2017 | Toya et al. | |
| 2019/0181068 A1 | 6/2019 | Funakawa et al. | |

FOREIGN PATENT DOCUMENTS

JP            2018-113391 A        7/2018

* cited by examiner

*Primary Examiner* — Andargie M Aychillhum
(74) *Attorney, Agent, or Firm* — Rimon P.C.

(57) ABSTRACT

Disclosed herein is a circuit board in which a conductor pattern having an annular structure is exposed to the surface thereof. The conductor pattern includes first and second land pattern parts and a first connection part connecting the first and second land pattern parts. The first connection part includes a first section connected to the first land pattern part, a second section connected to the second land pattern part, and a third section connecting the first and second sections. At least a part of the third section of the first connection part is larger in width than the first and section sections.

6 Claims, 6 Drawing Sheets

FIG. 10A
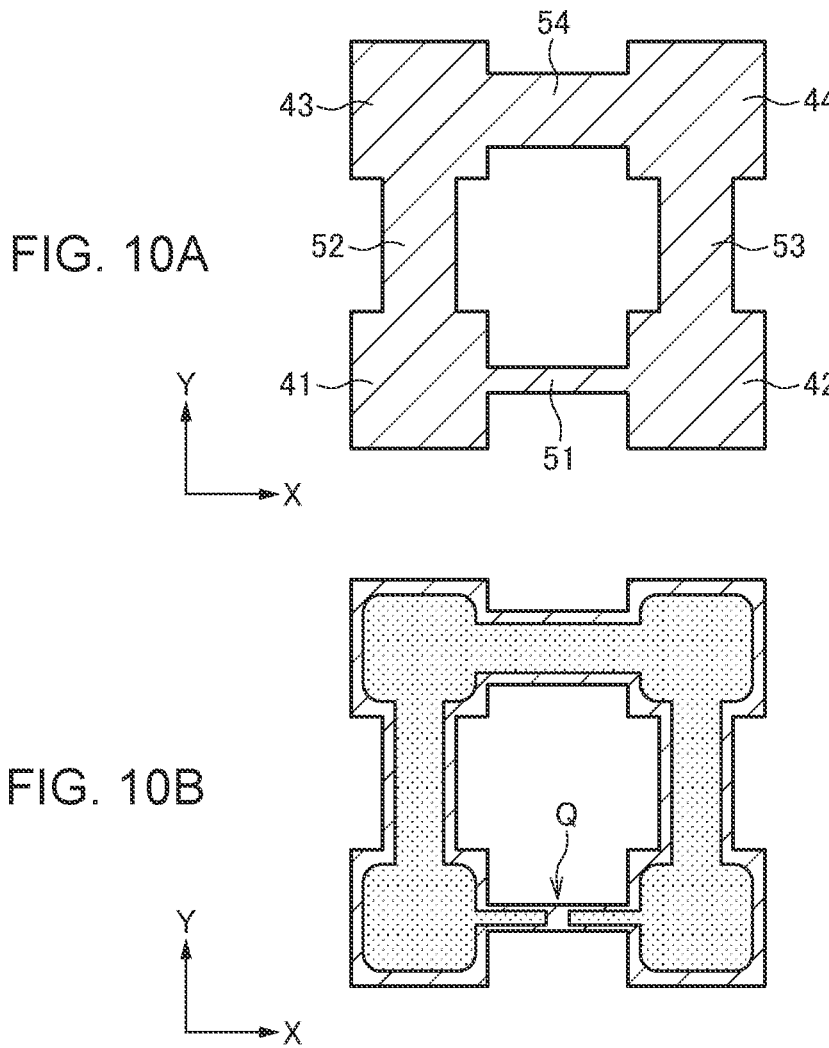
FIG. 10B
FIG. 11
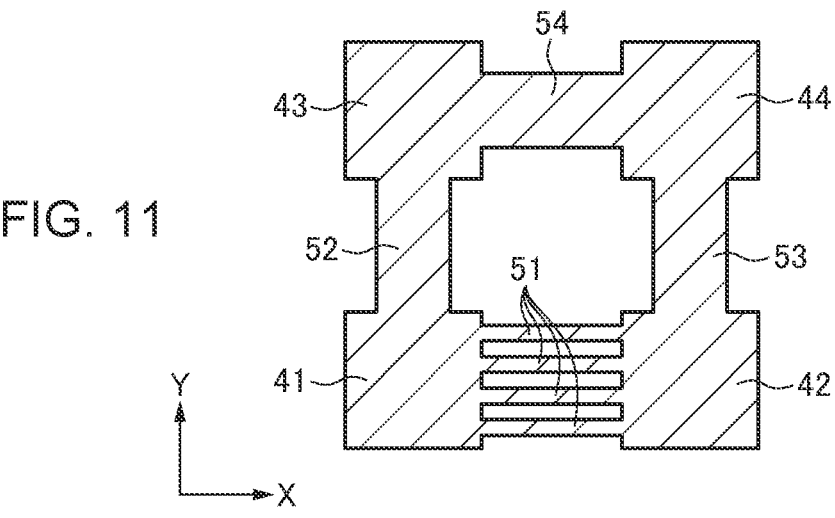

CIRCUIT BOARD

CROSS-REFERENCE TO RELATED APPLICATION

This application claims the benefit of Japanese Patent Application No. 2023-051593, filed on Mar. 28, 2023, the entire disclosure of which is incorporated by reference herein.

BACKGROUND OF THE ART

Field of the Art

The present disclosure relates to a circuit board and, more particularly, to a circuit board in which a conductor pattern having an annular structure is exposed to the surface thereof.

Description of Related Art

As disclosed in JP 2018-113391A, the surface of a circuit board is typically covered with a solder resist except for a land pattern used as an external terminal.

When the solder resist is omitted for the purpose of thinning the circuit board, conductor patterns formed on the surface of the circuit board are all exposed, with the result that a solder may flow into a portion other than the land pattern. Thus, when the conductor pattern exposed to the circuit board surface has an annular structure, a space surrounded by an annular solder may be closed.

SUMMARY

The present disclosure describes a technology for preventing formation of the closed space in a circuit board in which the annular conductor pattern is exposed to the surface thereof.

A circuit board according to one aspect of the present disclosure is a circuit board in which a conductor pattern having an annular structure is exposed to the surface thereof, and the conductor pattern includes first and second land pattern parts and a first connection part connecting the first and second land pattern parts. The first connection part includes a first section connected to the first land pattern part, a second section connected to the second land pattern part, and a third section connecting the first and second sections. At least a part of the third section is larger in width than the first and section sections.

A circuit board according to another aspect of the present invention is a circuit board in which a conductor pattern having an annular structure is exposed to the surface thereof, and the conductor pattern includes at least three land pattern parts including first and second land pattern parts and at least three connection parts including a first connection part connecting the first and second land pattern parts. The first connection part is smaller in width than other connection parts.

BRIEF DESCRIPTION OF THE DRAWINGS

The above features and advantages of the present disclosure will be more apparent from the following description of certain preferred embodiments taken in conjunction with the accompanying drawings, in which:

FIG. 10A is a plan view for explaining an eighth example of the shape of the conductor patterns in the conductor layers L1 and L4;

FIG. 10B is a schematic plan view showing a state that the solder supplied to the conductor pattern shown in FIG. 10A flows due to reflow; and FIG. 11 is a plan view for explaining a ninth example of the shape of the conductor patterns in the conductor layers L1 and L4.

DETAILED DESCRIPTION OF THE EMBODIMENTS

Some embodiments of the present disclosure will be explained below in detail with reference to the accompanying drawings.

Figure 1:
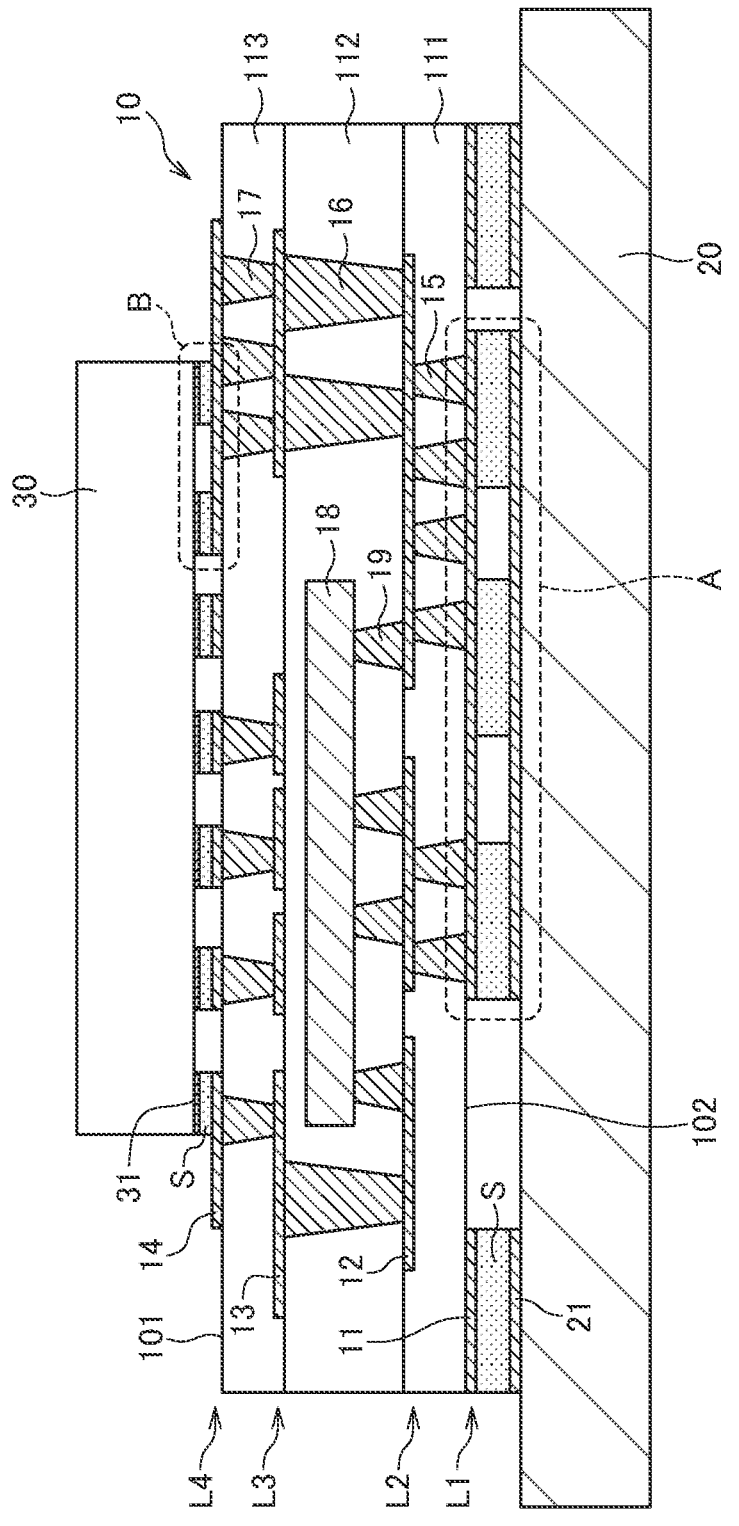
FIG. 1 is a schematic cross-sectional view for explaining the structure of a circuit board 10 according to one embodiment of the present disclosure.

FIG. 1 is a schematic cross-sectional view for explaining the structure of a circuit board 10 according to one embodiment of the technology described herein.

As illustrated in FIG. 1, the circuit board 10 according to the present embodiment has a structure in which a plurality of conductor layers L1 to L4 and a plurality of insulating layers 111 to 113 are alternately stacked. The conductor layers L1 to L4 respectively have conductor patterns 11 to 14. The conductor patterns 11 and 12 are connected to each other through a via conductor 15 penetrating the insulating layer 111, the conductor patterns 12 and 13 are connected to each other through a via conductor 16 penetrating the insulating layer 112, and the conductor patterns 13 and 14 are connected to each other through a via conductor 17 penetrating the insulating layer 113. Although not particularly limited, an electronic component 18 such as an RFIC is embedded in the insulating layer 112. The electronic component 18 is connected to the conductor pattern 12 through a via conductor 19.

A mounting component 30 including an electronic component such as a passive element represented by an LCR, or an IC is mounted on one surface 101 of the circuit board 10. A terminal electrode 31 of the mounting component 30 is connected to the conductor pattern 14 in the conductor layer L4 through a solder S. The thus configured circuit board 10 is mounted on another circuit board 20 such as a motherboard. A terminal electrode 21 of the circuit board 20 is connected to the conductor pattern 11 in the conductor layer L1 through the solder S.

In the circuit board 10 according to the present embodiment, the surfaces 101 and 102 are not covered with a solder resist, and thus the conductor patterns 11 and 14 in the respective conductor layers L1 and L4 are exposed. That is, in the conductor layer L1, not only a land pattern part connected to the terminal electrode 21 of the circuit board 20, but also all the conductor patterns 11 are exposed, and in the conductor layer L4, not only a land pattern part connected to the terminal electrode 31 of the mounting component 30, but also all the conductor patterns 14 are exposed.

The plurality of land pattern parts provided in the conductor layer L1 may be connected through another conductor pattern in the conductor layer L1. Similarly, the plurality of land pattern parts provided in the conductor layer L4 may be connected through another conductor pattern in the conductor layer L4. Specifically, in the example illustrated in FIG. 1, the plurality of land pattern parts are connected to one another at a portion A on the conductor layer L1, and the plurality of land pattern parts are connected to one another at a portion B on the conductor layer L4.

Figure 2A:
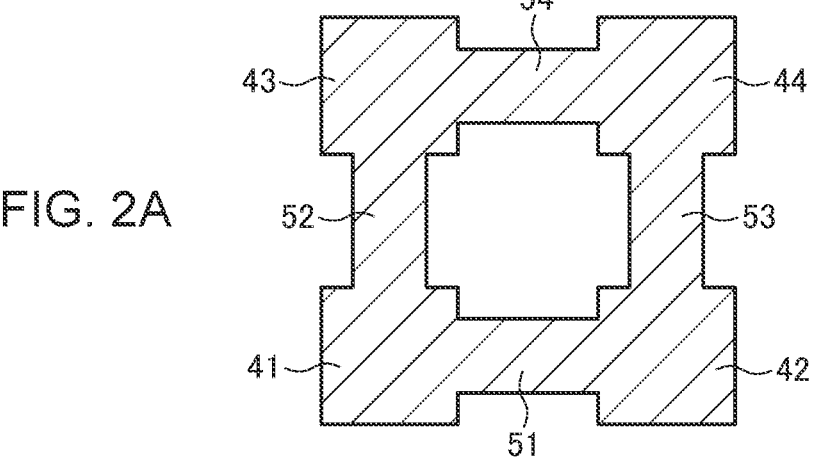
FIG. 2A is a plan view showing an example of a conductor pattern having an annular structure.
Figure 2B:
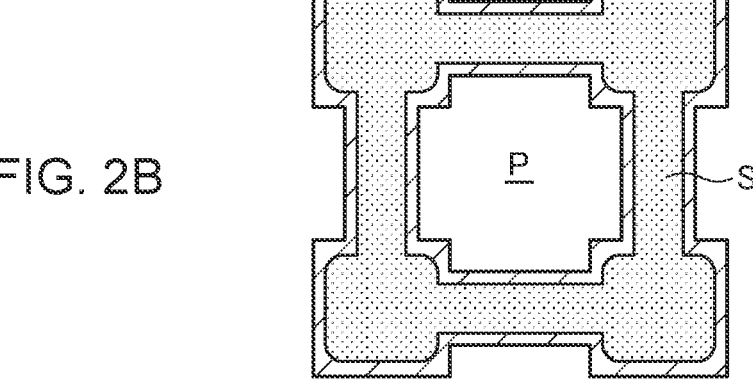
FIG. 2B is a schematic plan view showing a state that the solder supplied to the conductive pattern shown in FIG. 2A flows due to reflow.

When the plurality of land pattern parts are connected on the same conductor layer, a conductor pattern may form an annular structure as in the example illustrated in FIG. 2A. In the example of FIG. 2A, four land pattern parts 41 to 44 and four connection parts 51 to 54 connecting the four land pattern parts 41 to 44 form an annular structure. In this case, when such an annular stricture is connected to the terminal electrode 21 or 31 through the solder S, a closed space P surrounded by the annular solder S may be formed as illustrated in FIG. 2B. In such a case, a volatile component contained in a flux, or gas or moisture generated from the insulating layers 111 to 113 may stay in the thus formed closed space P without being released, which may cause corrosion or the like to deteriorate reliability. Further, gas accumulated in the closed space P is expanded at the time of reflow to expand the closed space P, with the result that a part of the land pattern part may fail to contact the solder S, which may deteriorate connection reliability. Furthermore, gas accumulated in the closed space P at the time of reflow may break the wall of the solder S to be scattered.

In the circuit board 10 according to the present disclosure, the shape of the connection part connecting the land pattern parts is changed as follows so as not to form the closed space P even when the conductor pattern has such an annular structure.

Figure 3A:
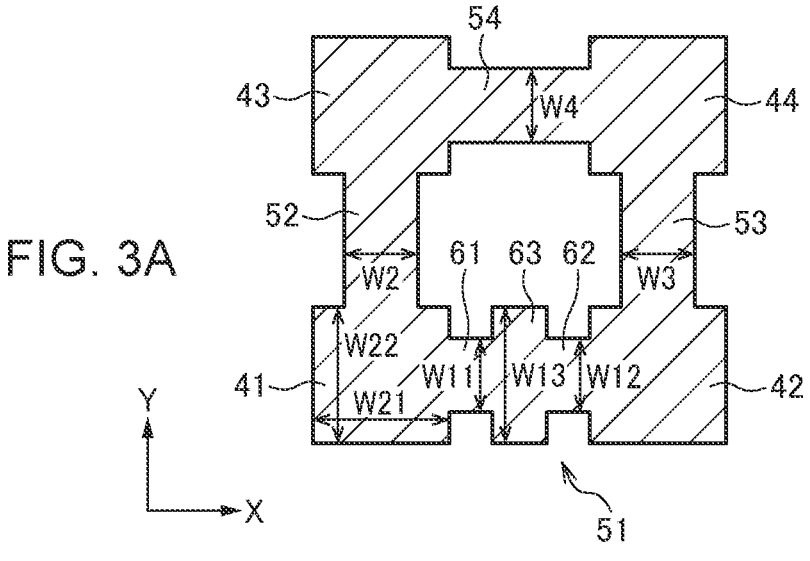
FIG. 3A is a plan view for explaining a first example of the shape of the conductor patterns in the conductor layers L1 and L4.

FIG. 3A is a plan view for explaining a first example of the conductor pattern shape in the conductor layers L1 and L4. In the example illustrated in FIG. 3A, the conductor pattern includes four land pattern parts 41 to 44 and four connection parts 51 to 54. The land pattern parts 41 and 42 are arranged in the X-direction, the land pattern parts 43 and 44 are arranged in the X-direction, the land pattern parts 41 and 43 are arranged in the Y-direction, and the land pattern parts 42 and 44 are arranged in the Y-direction. The connection part 51 extends in the X-direction to connect the land pattern parts 41 and 42. The connection part 52 extends in the Y-direction to connect the land pattern parts 41 and 43.

The connection part 53 extends in the Y-direction to connect the land pattern parts 42 and 44. The connection part 54 extends in the X-direction to connect the land pattern parts 43 and 44. With this configuration, the land pattern parts 41 to 44 and connection parts 51 to 54 form an annular structure.

In the first example illustrated in FIG. 3A, the width of the connection part 51 is locally increased. Specifically, the connection part 51 includes a section 61 connected to the land pattern part 41, a section 62 connected to the land pattern part 42, and a section 63 connecting the sections 61 and 62, and a width W13 of the section 63 is made larger than widths W11 and W12 of the respective sections 61 and 62. The widths of the connection parts are each defined as the size of the conductor pattern in a direction perpendicular to the extending direction of the connection part. Accordingly, the widths W11 to W13 of the respective sections 61 to 63 are each the size of the conductor pattern in the Y-direction. Widths W2 to W4 of the other respective connection parts 52 to 54 are constant. The widths W11 and W12 of the respective sections 61 and 62 may be the same as the widths W2 to W4 of the respective connection parts 52 to 54. Widths W21 and W22 of the land pattern parts 41 to 44 in the respective X- and Y-directions are larger than the widths W2 to W4.

Figure 3B:
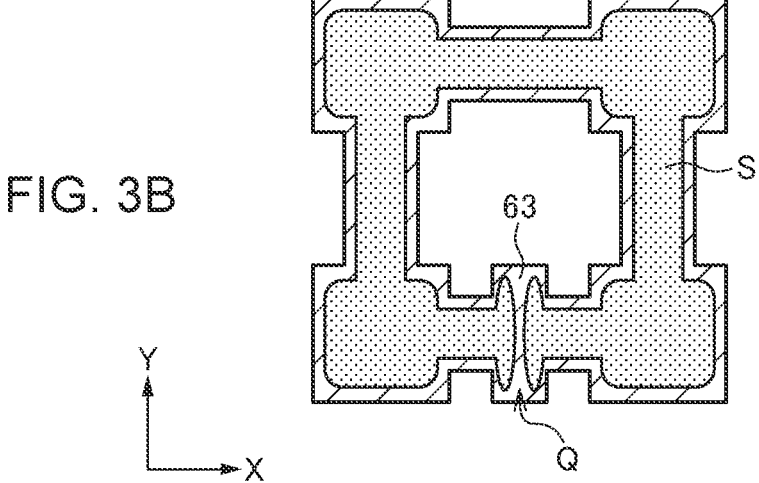
FIG. 3B is a schematic plan view showing a state that the solder supplied to the conductor pattern shown in FIG. 3A flows due to reflow.
Figure 3C:
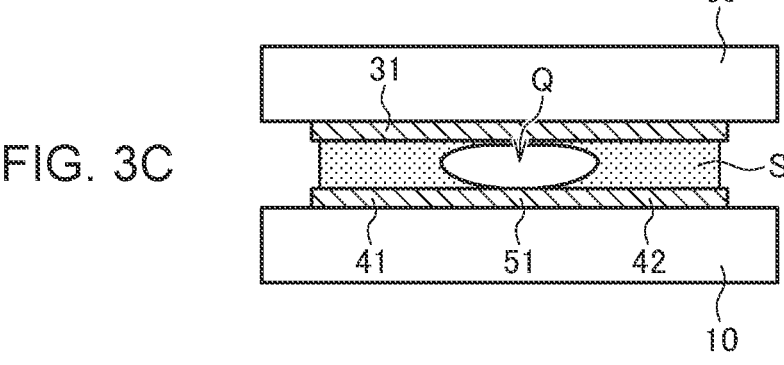
FIG. 3C is a schematic cross-sectional view showing a state that the solder supplied to the conductor pattern shown in FIG. 3A flows due to reflow.

With such a configuration, when making a connection to the terminal electrode 21 or 31 via the solder S, the amount of the solder S per unit area in the section 63 becomes smaller than that in other regions as illustrated in FIG. 3B, with the result that, as illustrated in FIG. 3C, a hole Q is formed in the wall of the solder S in the section 63. This is because, although the solder S supplied to the land pattern parts 41 and 42 flows into the section 63 from the sections 61 and 62 at the time of reflow, the amount of the solder S per unit area locally decreases in the section 63 since the width W13 of the section 63 is larger than the widths W11 and W12 of the respective sections 61 and 62. In the first example illustrated in FIG. 3A, such a mechanism allows formation of the hole Q in the wall of the solder S without forming the closed space P surrounded by the annular solder S.

In addition, when the widths W11 and W12 of the respective sections 61 and 62 are made the same as the widths W2 to W4 of the respective connection parts 52 to 54, it is only necessary to increase only the width W13 of the section 63, facilitating designing. On the other hand, when the widths W11 and W12 of the respective sections 61 and 62 are made smaller than the widths W2 to W4 of the respective connection parts 52 to 54, the amount of the solder S flowing into the section 63 decreases, allowing a further decrease in the amount of the solder S per unit area in the section 63.

Figure 4:
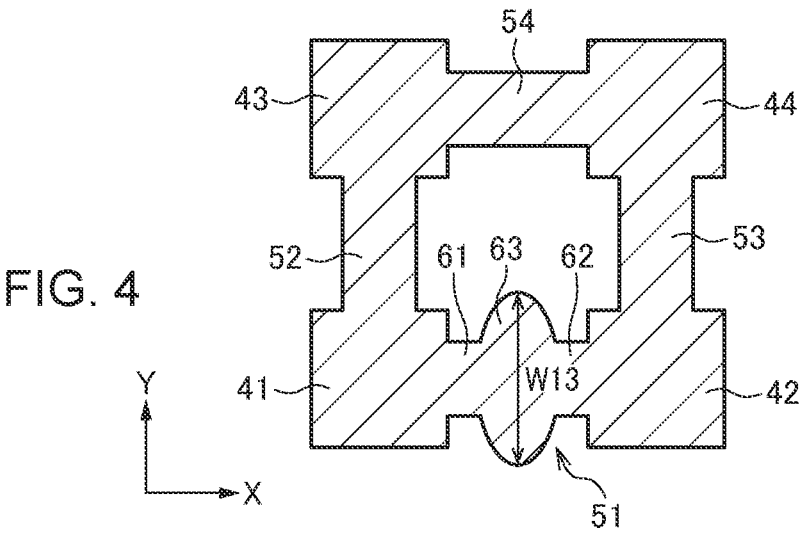
FIG. 4 is a plan view for explaining a second example of the shape of the conductor patterns in the conductor layers L1 and L4.
Figure 5:
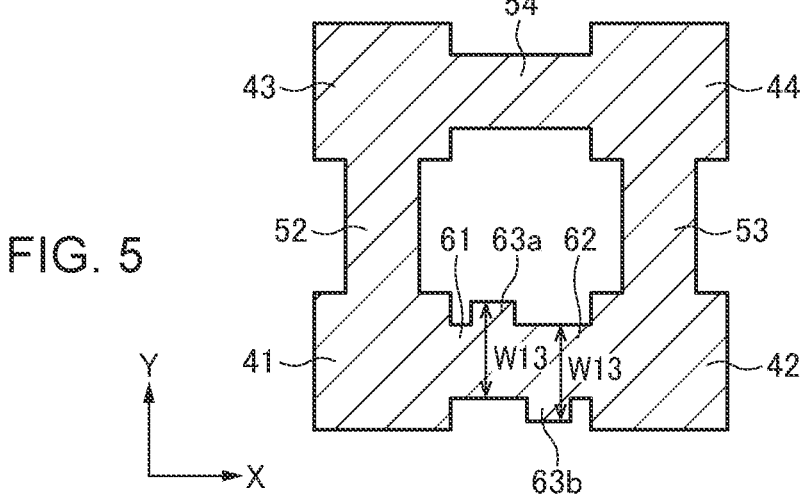
FIG. 5 is a plan view for explaining a third example of the shape of the conductor patterns in the conductor layers L1 and L4.
Figure 6:
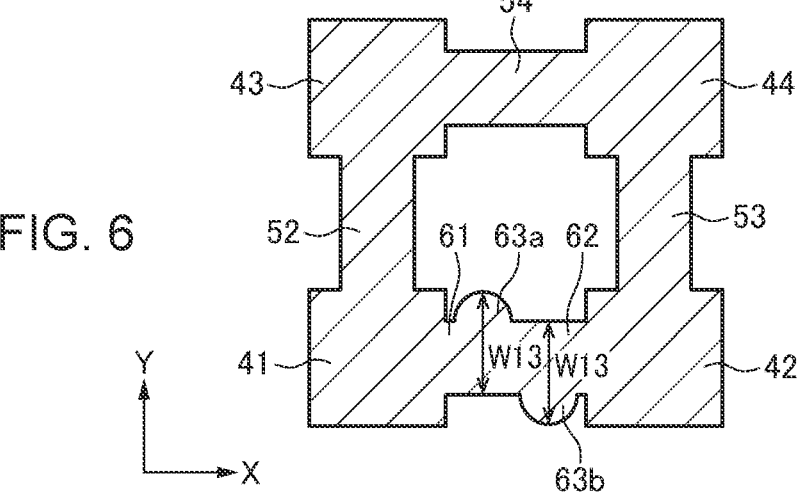
FIG. 6 is a plan view for explaining a fourth example of the shape of the conductor patterns in the conductor layers L1 and L4.
Figure 7:
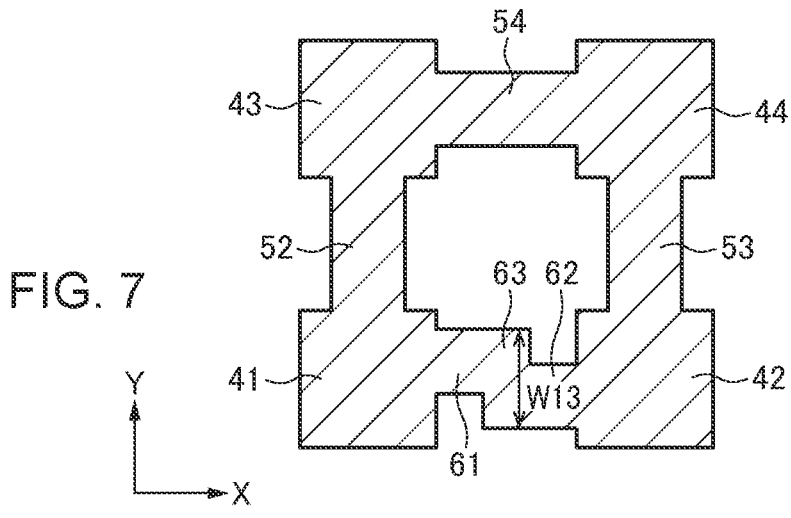
FIG. 7 is a plan view for explaining a fifth example of the shape of the conductor patterns in the conductor layers L1 and L4.
Figure 8:
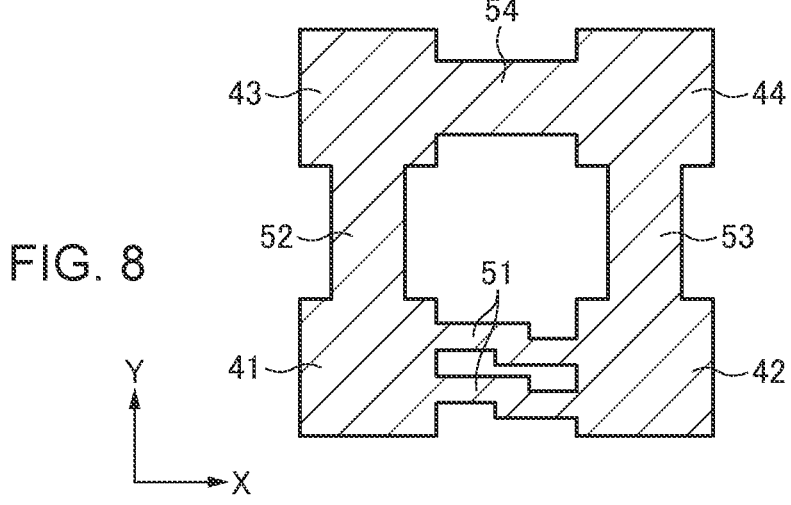
FIG. 8 is a plan view for explaining a sixth example of the shape of the conductor patterns in the conductor layers L1 and L4.
Figure 9:
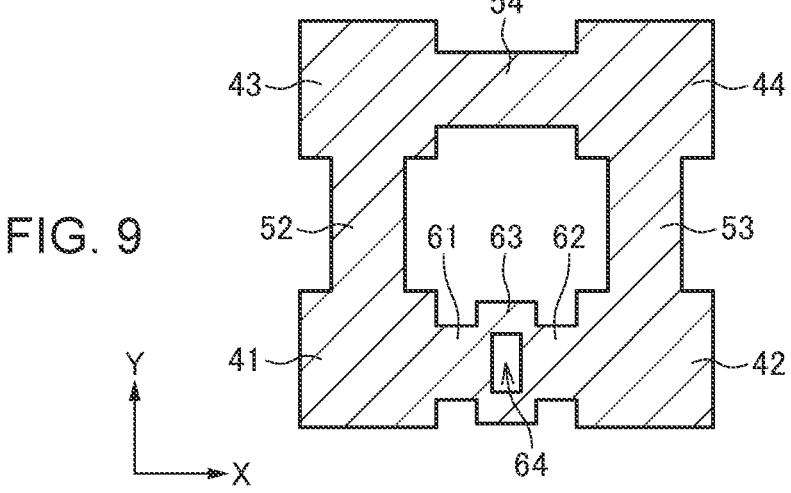
FIG. 9 is a plan view for explaining a seventh example of the shape of the conductor patterns in the conductor layers L1 and L4.

Although the width W13 of the section 63 is constant in the first example illustrated in FIG. 3A, it may increase with distance from the sections 61 and 62 as illustrated in a second example illustrated in FIG. 4. Further, as in third and fourth examples respectively illustrated in FIGS. 5 and 6, the section 63 may have protruding parts 63a and 63b protruding in the Y-direction from different X-direction positions. Further, as in a fifth example illustrated in FIG. 7, the connection part 51 may be formed into a crank shape so as to enlarge the width W13 of the section 63. Further, as in a sixth example illustrated in FIG. 8, a plurality of crank-shaped connection parts 51 may be provided. Further, as in a seventh example illustrated in FIG. 9, an opening 64 having no conductor pattern may be formed to make the section 63 have an annular structure. Forming the thus configured opening 64 impedes flowing of the solder S, thus facilitating formation of the hole Q in the wall of the solder S.

Further, as in an eighth example illustrated in FIG. 10A, the width of the connection part 51 may be set to a width W1 which is smaller than the widths W2 to W4 of the respective connection parts 52 to 54. This reduces the amount of the solder S flowing into the connection part 51 as compared to the amount of the solder S flowing into each of the connection parts 52 to 54, making it possible to form the hole Q in the wall of the solder S in the connection part 51 as illustrated in FIG. 10B. To reduce a connection resistance between adjacent pads in the configuration illustrated in FIG. 10A, a plurality of thin connection parts 51 may be provided as in a ninth example illustrated in FIG. 11.

While the preferred embodiment of the present disclosure has been described, the present disclosure is not limited to the above embodiment, and various modifications may be made within the scope of the present disclosure, and all such modifications are included in the present disclosure.

The technology according to the present disclosure includes the following configuration examples but not limited thereto.

A circuit board according to one aspect of the present disclosure is a circuit board in which a conductor pattern having an annular structure is exposed to the surface thereof, and the conductor pattern includes first and second land pattern parts and a first connection part connecting the first and second land pattern parts. The first connection part includes a first section connected to the first land pattern part, a second section connected to the second land pattern part, and a third section connecting the first and second sections. At least a part of the third section is larger in width than the first and section sections. This reduces the amount of a solder per unit area in the third section, preventing formation of a closed space.

In the above circuit board, the conductor pattern may further include third and fourth land pattern parts, a second connection part connecting the first and third land pattern parts, a third connection part connecting the second and fourth land pattern parts, and a fourth connection part connecting the third and fourth land pattern parts, and at least a part of the third section of the first connection part may be larger in width than the second to fourth connection parts. This can further reduce the amount of a solder per unit area in the third section.

In the above circuit board, the first and second sections of the first connection part may be the same in width as the second to fourth connection parts. This facilitates the designing of the conductor pattern. Alternatively, the first and second sections of the first connection part may be smaller in width than the second to fourth connection patterns. This can further reduce the amount of a solder flowing into the third section.

In the above circuit board, the third section of the first connection part may have an annular structure surrounding an opening having no conductor pattern. This impedes flowing of a solder due to the presence of the opening, facilitating formation of a hole in the wall of the solder.

A circuit board according to another aspect of the present invention is a circuit board in which a conductor pattern having an annular structure is exposed to the surface thereof, and the conductor pattern includes at least three land pattern parts including first and second land pattern parts and at least three connection parts including a first connection part connecting the first and second land pattern parts. The first connection part is smaller in width than other connection parts. This makes the amount of a solder flowing into the first connection part smaller than that flowing into other connection parts, making it possible to form a hole in the wall of the solder in the first connection part.

What is claimed is:

1. A circuit board comprising:
   a surface; and
   a conductor pattern having an annular structure exposed to the surface,
   wherein the conductor pattern includes first and second land pattern parts and a first connection part connecting the first and second land pattern parts,
   wherein the first connection part includes a first section connected to the first land pattern part, a second section connected to the second land pattern part, and a third section connecting the first and second sections, and
   wherein at least a part of the third section of the first connection part is larger in width than the first and second sections.

2. The circuit board as claimed in claim 1,
   wherein the conductor pattern further includes third and fourth land pattern parts, a second connection part connecting the first and third land pattern parts, a third connection part connecting the second and fourth land pattern parts, and a fourth connection part connecting the third and fourth land pattern parts, and
   wherein at least a part of the third section of the first connection part is larger in width than the second to fourth connection parts.

3. The circuit board as claimed in claim 2, wherein each of the first and second sections of the first connection part is a same in width as the second to fourth connection parts.

4. The circuit board as claimed in claim 2, wherein each of the first and second sections of the first connection part is smaller in width than the second to fourth connection patterns.

5. The circuit board as claimed in claim 1, wherein the third section of the first connection part has an annular structure surrounding an opening having no conductor pattern.

6. A circuit board comprising:
   a surface; and
   a conductor pattern having an annular structure exposed to the surface,
   wherein the conductor pattern includes at least three land pattern parts including first and second land pattern parts and at least three connection parts including a first connection part connecting the first and second land pattern parts, and
   wherein the first connection part is smaller in width than other connection parts.

* * * * *